(12) United States Patent
Tajima

(10) Patent No.: US 10,707,048 B2
(45) Date of Patent: Jul. 7, 2020

(54) DEFLECTION SENSITIVITY CALCULATION METHOD AND DEFLECTION SENSITIVITY CALCULATION SYSTEM

(71) Applicant: EBARA CORPORATION, Tokyo (JP)

(72) Inventor: Ryo Tajima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 3 days.

(21) Appl. No.: 16/253,767

(22) Filed: Jan. 22, 2019

(65) Prior Publication Data
US 2019/0237293 A1  Aug. 1, 2019

(30) Foreign Application Priority Data

Jan. 29, 2018 (JP) ................................ 2018-012442

(51) Int. Cl.
| | | |
|---|---|---|
| H01J 37/147 | (2006.01) | |
| H01J 37/20 | (2006.01) | |
| H01J 37/30 | (2006.01) | |
| H01J 37/302 | (2006.01) | |
| H01J 37/317 | (2006.01) | |
| H01J 37/06 | (2006.01) | |

(52) U.S. Cl.
CPC .......... *H01J 37/1475* (2013.01); *H01J 37/06* (2013.01); *H01J 37/1477* (2013.01); *H01J 37/20* (2013.01); *H01J 37/302* (2013.01); *H01J 37/3002* (2013.01); *H01J 37/317* (2013.01); *H01J 2237/24535* (2013.01)

(58) Field of Classification Search
CPC ........ H01J 37/00; H01J 37/02; H01J 37/1472; H01J 37/1475; H01J 37/243; H01J 37/22; H01J 37/222; H01J 37/30; H01J 37/3007; H01J 37/302

USPC ................................ 250/396 R, 492.1, 492.3
See application file for complete search history.

(56) References Cited

U.S. PATENT DOCUMENTS

| | | | | |
|---|---|---|---|---|
| 6,110,318 A | * | 8/2000 | Goodman | ............... B29C 35/08 156/272.2 |
| 2013/0068611 A1 | * | 3/2013 | Botman | .................... C25D 5/04 204/192.11 |
| 2015/0371813 A1 | | 12/2015 | Hatakeyama et al. | |
| 2016/0336145 A1 | * | 11/2016 | Ominami | .............. H01J 37/222 |

FOREIGN PATENT DOCUMENTS

JP    2016-027604 A    2/2016

* cited by examiner

*Primary Examiner* — Jason L McCormack
(74) *Attorney, Agent, or Firm* — Pearne & Gordon LLP

(57) ABSTRACT

According to one embodiment, provided is a deflection sensitivity calculation method for calculating deflection sensitivity of a deflector in an electron beam irradiation apparatus that irradiates an irradiation object on a stage with an electron beam by causing the deflector to deflect the electron beam, the deflection sensitivity calculation method including: irradiating an area that covers an adjustment plate with an electron beam by scanning a deflection parameter that controls deflection of the deflector in a predetermined width; detecting a current value detected from the adjustment plate; forming an image corresponding to the detected current value, a number of pixels of the image being known; calculating the number of pixels of a portion corresponding to the adjustment plate in the formed image; and calculating the deflection sensitivity of the deflector.

16 Claims, 17 Drawing Sheets

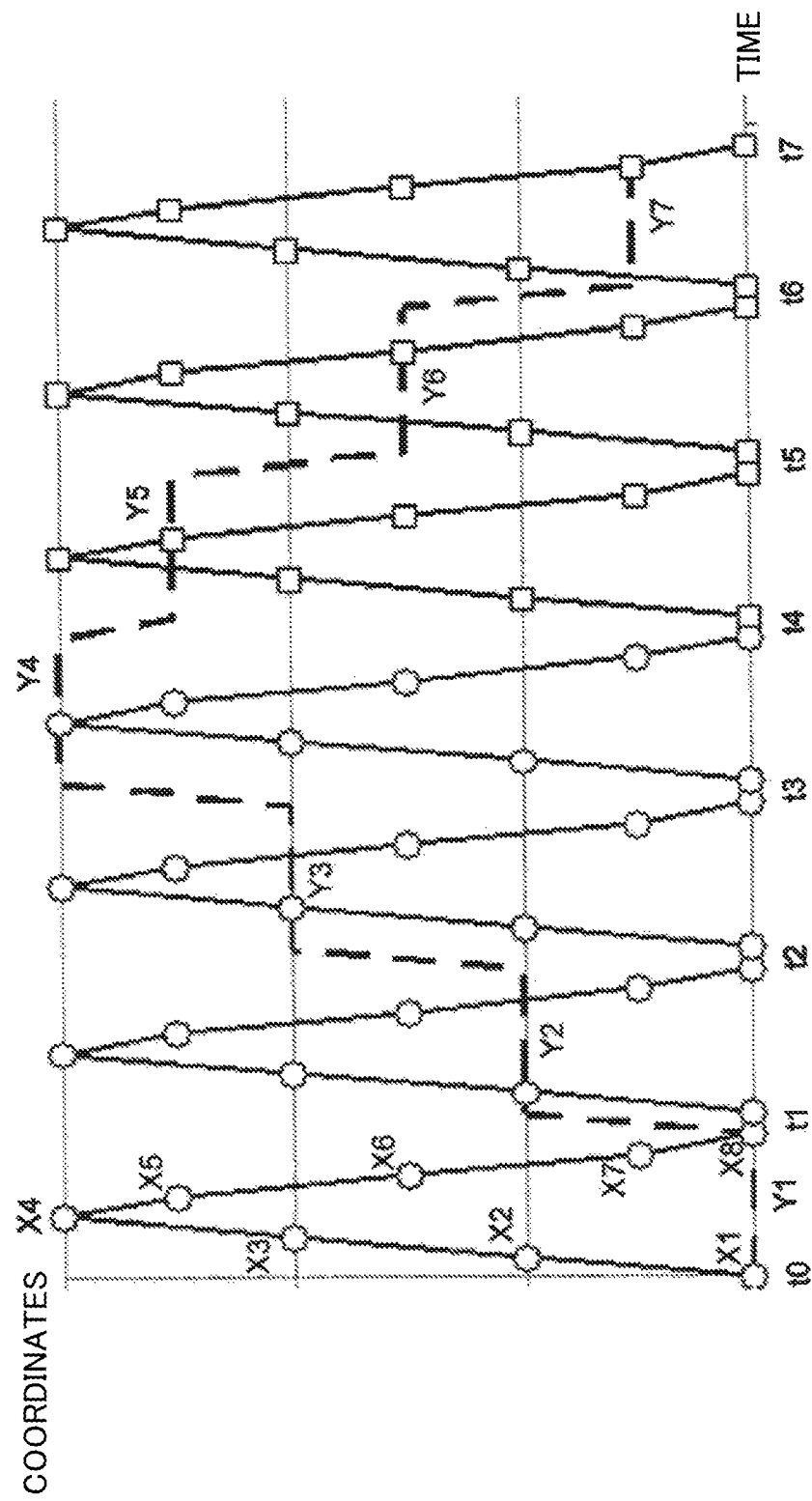

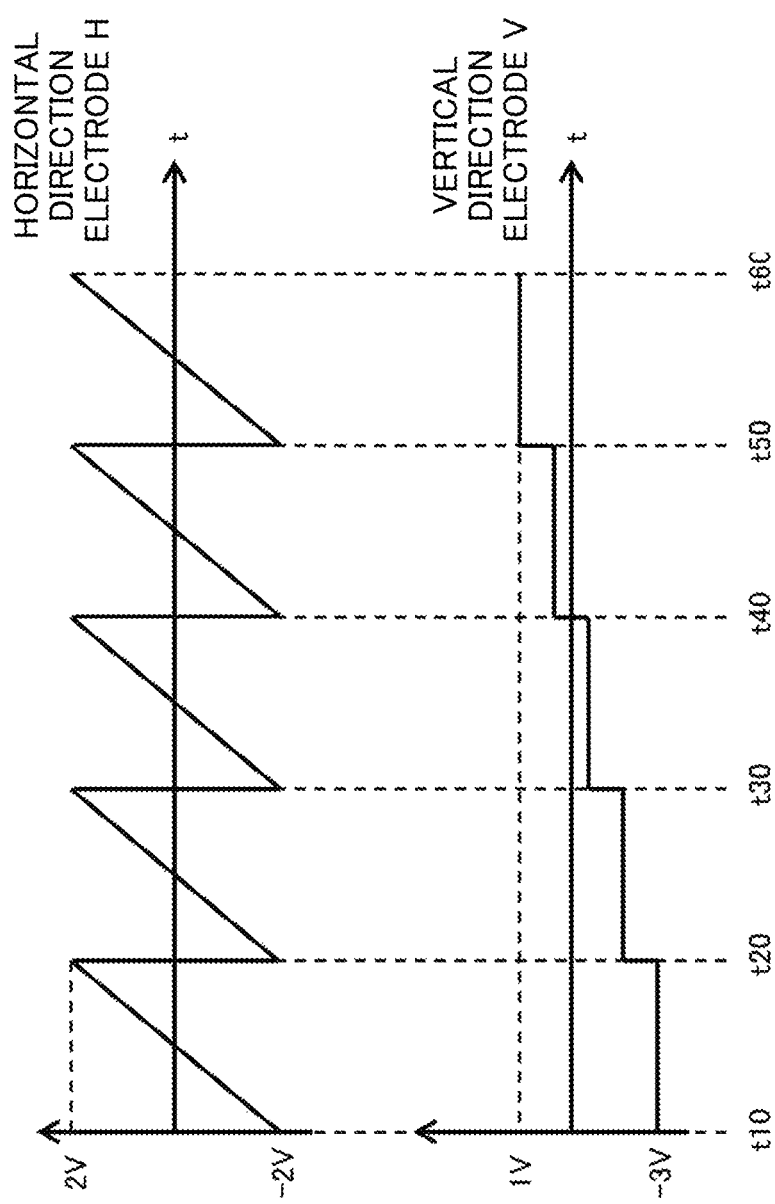

DEFLECTION SENSITIVITY CALCULATION METHOD AND DEFLECTION SENSITIVITY CALCULATION SYSTEM

CROSS-REFERENCE TO RELATED APPLICATIONS

This application claims the benefit of Japanese Priority Patent Application JP 2018-12442 filed on Jan. 29, 2018, the entire contents of which are incorporated herein by reference.

FIELD

The present technique relates to a deflection sensitivity calculation method and a deflection sensitivity calculation system that calculate deflection sensitivity of a deflector in an electron beam irradiation apparatus.

BACKGROUND AND SUMMARY

The electron beam irradiation apparatus irradiates a mask with an electron beam, for example, in a manufacturing process of a semiconductor device and thereby improves etching resistance of the mask. The electron beam irradiation apparatus is provided with a deflector. The deflector deflects the electron beam, so that the electron beam irradiation apparatus can irradiate an arbitrary area of the mask with the electron beam.

However, the deflection sensitivity of the deflector (how much the electron beam is deflected) is not necessarily constant, but may vary, so that the electron beam may not be irradiated to a desired area. Therefore, it is desired to improve the deflection sensitivity of the deflector in the electron beam irradiation apparatus.

According to one embodiment of the present disclosure, provided is a deflection sensitivity calculation method for calculating deflection sensitivity of a deflector in an electron beam irradiation apparatus that irradiates an irradiation object on a stage with an electron beam by causing the deflector to deflect the electron beam, the deflection sensitivity calculation method including:

irradiating an area that covers an adjustment plate with an electron beam by scanning a deflection parameter that controls deflection of the deflector in a predetermined width, a size the adjustment plate being known, the adjustment plate being placed on the stage, the adjustment plate detecting a current corresponding to the irradiated electron beam;

detecting a current value detected from the adjustment plate;

forming an image corresponding to the detected current value, a number of pixels of the image being known;

calculating the number of pixels of a portion corresponding to the adjustment plate in the formed image; and calculating the deflection sensitivity of the deflector based on the size of the adjustment plate, the predetermined width for scanning the deflection parameter, the number of pixels of the image, and the number of pixels of the portion corresponding to the adjustment plate in the image.

According to one embodiment of the present disclosure, a deflection sensitivity calculation system for calculating deflection sensitivity of a deflector in an electron beam irradiation apparatus that irradiates an irradiation object on a stage with an electron beam by causing the deflector to deflect the electron beam, the deflection sensitivity calculation system including:

an adjustment plate that detects a current corresponding to the irradiated electron beam, a size of the adjustment plate being known, the adjustment plate being placed on the stage;

an ammeter that detects a current detected from the adjustment plate while an area that covers the adjustment plate is irradiated with the electron beam by scanning a deflection parameter that controls deflection of the deflector in a predetermined width;

an image forming module that forms an image corresponding to the detected current value;

a number of pixels calculator that calculates a number of pixels of a portion corresponding to the adjustment plate in the formed image; and a deflection sensitivity calculator that calculates the deflection sensitivity of the deflector based on a size of the adjustment plate, the predetermined width for scanning the deflection parameter, the number of pixels of the image, and the number of pixels of the portion corresponding to the adjustment plate in the image.

BRIEF DESCRIPTION OF DRAWINGS

FIG. 1E is an explanatory diagram of control of deflecting an electron beam in an XY direction;

FIG. 2CB is a diagram schematically showing an irradiation area of the electron beam with respect to the adjustment plate 21;

FIG. 2E is a diagram showing temporal changes in voltages applied to electrodes 2115;

FIG. 2FB is a diagram showing a relationship between the irradiation area in FIG. 2CB and time;

FIG. 2GB is a diagram showing temporal changes in an acquired current value;

FIG. 2HB is a diagram showing image data formed corresponding to the current values shown in FIG. 2GB;

FIG. 3DB is a diagram schematically showing a vertical direction profile; and

DETAILED DESCRIPTION OF NON-LIMITING EXAMPLE EMBODIMENTS

Figure 1A:
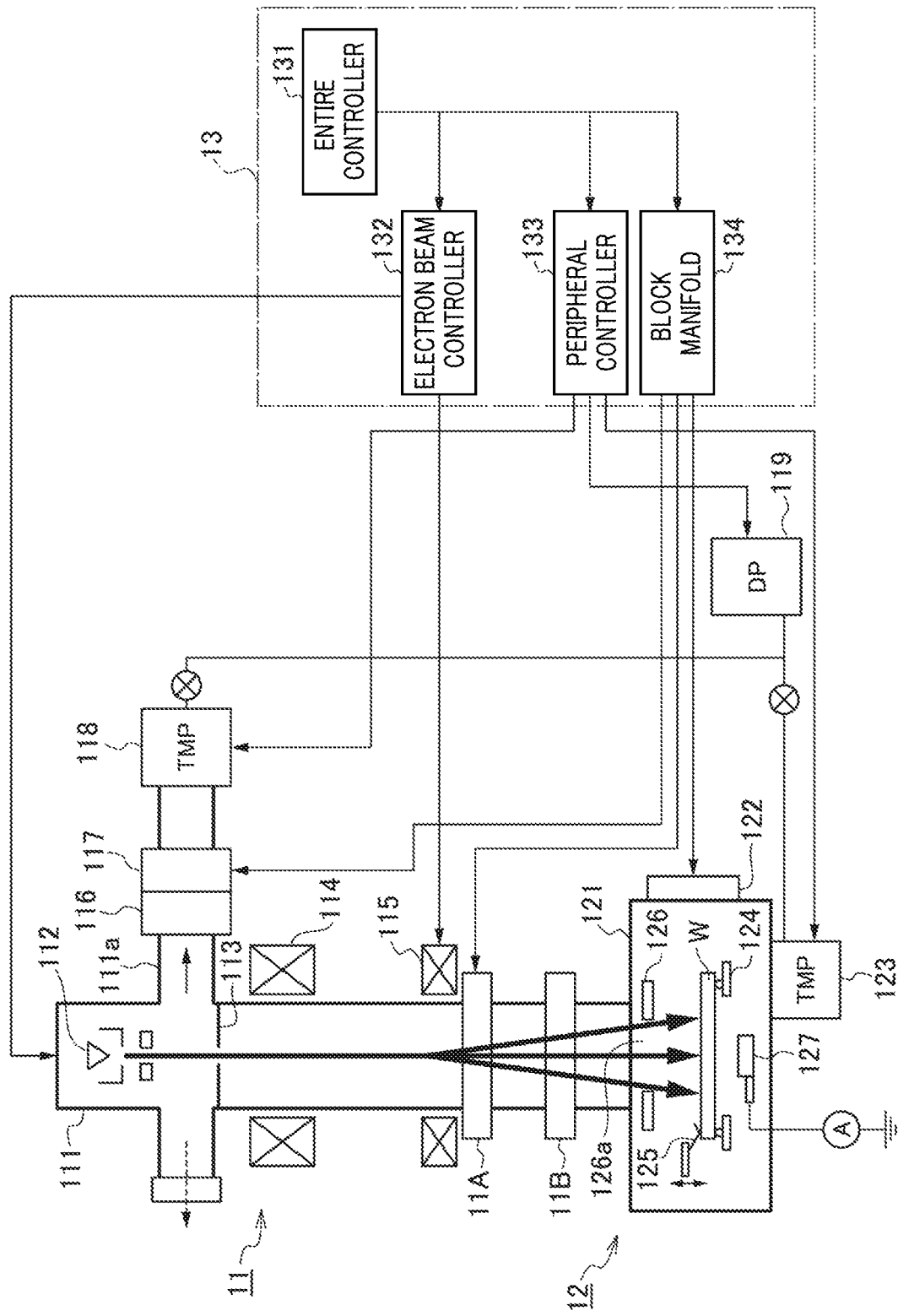
FIG. 1A is a diagram schematically showing an approximate configuration of an electron beam irradiation apparatus.

According to one embodiment, provided is a deflection sensitivity calculation method for calculating deflection sensitivity of a deflector in an electron beam irradiation apparatus that irradiates an irradiation object on a stage with an electron beam by causing the deflector to deflect the electron beam, the deflection sensitivity calculation method including: irradiating an area that covers an adjustment plate with an electron beam by scanning a deflection parameter that controls deflection of the deflector in a predetermined width, a size the adjustment plate being known, the adjustment plate being placed on the stage, the adjustment plate detecting a current corresponding to the irradiated electron beam; detecting a current value detected from the adjustment plate; forming an image corresponding to the detected current value, a number of pixels of the image being known; calculating the number of pixels of a portion corresponding to the adjustment plate in the formed image; and calculating the deflection sensitivity of the deflector based on the size of the adjustment plate, the predetermined width for scanning the deflection parameter, the number of pixels of the image, and the number of pixels of the portion corresponding to the adjustment plate in the image.

Specifically, the adjustment plate may be a rectangular shape of which a length in a first direction is Dx and of which a length in a second direction perpendicular to the first direction is Dy, and when assuming that the predetermined widths for scanning the deflection parameter in the first direction and the second direction are Vx and Vy, respectively, and that the numbers of pixels of the image in the first direction and the second direction are Px and Py, respectively, and and that the numbers of pixels of the portion corresponding to the adjustment plate in the image in the first direction and the second direction are X and Y, respectively, deflection sensitivity Sx in the first direction may be represented by a following formula (1) or a reciprocal thereof, and deflection sensitivity Sy in the second direction may be represented by a following formula (2) or a reciprocal thereof:

$$Sx = (Dx \cdot Px)/(X \cdot Vx) \quad (1)$$

$$Sy = (Dy \cdot Py)/(Y \cdot Vy) \quad (2)$$

The image may be formed by converting the current value acquired each time into a gradation level of each pixel in the image.

A gradation profile of the image may be generated, and a half-width of the generated profile may be defined as the number of pixels of the portion corresponding to the adjustment plate.

The deflection sensitivity calculation method may include setting the calculated deflection sensitivity as an apparatus constant of the electron beam irradiation apparatus.

The deflector may be an electrostatic deflector including an electrode, and the deflection parameter may be a voltage value applied to the electrode.

The deflector may be a magnetic field deflector including a magnetic pole, and the deflection parameter may be a current value supplied to the magnetic pole.

The deflection sensitivity calculation method may be performed when the electron beam irradiation apparatus is started up, an electron beam generation apparatus is replaced in the electron beam irradiation apparatus, the external magnetic field varies, and maintenance is performed.

According to one embodiment, a deflection sensitivity calculation system for calculating deflection sensitivity of a deflector in an electron beam irradiation apparatus that irradiates an irradiation object on a stage with an electron beam by causing the deflector to deflect the electron beam, the deflection sensitivity calculation system including: an adjustment plate that detects a current corresponding to the irradiated electron beam, a size of the adjustment plate being known, the adjustment plate being placed on the stage; an ammeter that detects a current detected from the adjustment plate while an area that covers the adjustment plate is irradiated with the electron beam by scanning a deflection parameter that controls deflection of the deflector in a predetermined width; an image forming module that forms an image corresponding to the detected current value; a number of pixels calculator that calculates a number of pixels of a portion corresponding to the adjustment plate in the formed image; and a deflection sensitivity calculator that calculates the deflection sensitivity of the deflector based on a size of the adjustment plate, the predetermined width for scanning the deflection parameter, the number of pixels of the image, and the number of pixels of the portion corresponding to the adjustment plate in the image.

First Embodiment

First, a basic configuration of an electron beam irradiation apparatus will be described.

FIG. 1A is a diagram schematically showing an approximate configuration of the electron beam irradiation apparatus. A sample W that is a processing object of the electron beam irradiation apparatus is a mask for NIL (Nano Imprint Lithography), a photomask, an EUV (Extreme Ultraviolet Lithography) mask, and the like and is suitable for processing a mask used to form a fine pattern of particularly 100 nm or less and more particularly 20 nm or less. The sample W may be a semiconductor wafer of Si, GaAs, or the like.

The electron beam irradiation apparatus includes a column module 11, a main chamber module 12 provided under the column module 11, and a controller 13.

The column module 11 has a cylindrical vacuum tube 111 extending in a vertical direction, an electron beam generation apparatus 112, an aperture 113, a lens 114, a deflector 115, a sensor unit 116, a gate valve 117, a turbo molecular pump 118, a gate valve 11A, and a particle catcher 11B.

The electron beam generation apparatus 112 is provided in an upper portion of the vacuum tube 111 and emits an electron bean downward. A configuration example of the electron beam generation apparatus 112 will be described in a seventh embodiment. The aperture 113 is provided below the electron beam generation apparatus 112. The electron beam passes through an opening which is formed in the center of the aperture and has a diameter of 2 mm or less.

The deflector 115 is provided below the lens 114 and can deflect the electron beam. The lens 114 may be an electrostatic lens arranged in the vacuum tube 111 or may be a magnetic field lens arranged outside the vacuum tube 111. The deflector 115 may be an electrostatic deflector arranged in the vacuum tube 111 or may be a magnetic field deflector arranged outside the vacuum tube 111.

The vacuum tube 111 has an intermediate evacuation line 111a that horizontally branches between the electron beam generation apparatus 112 and the aperture 113, and the sensor unit 116, the gate valve 117, and the turbo molecular pump 118 are arranged in this order in the intermediate evacuation line 111a.

By this configuration, the inside of the vacuum tube 111 can be differentially evacuated, and the pressure in the vicinity of the electron beam generation apparatus 112 can be made lower than the pressure in the main chamber module 12. In addition to the aperture 113, a small-diameter tube (not shown in the drawings) may be provided below the aperture 113 to adjust conductance. In this manner, the effect of the differential evacuation may be increased.

Figure 1B:
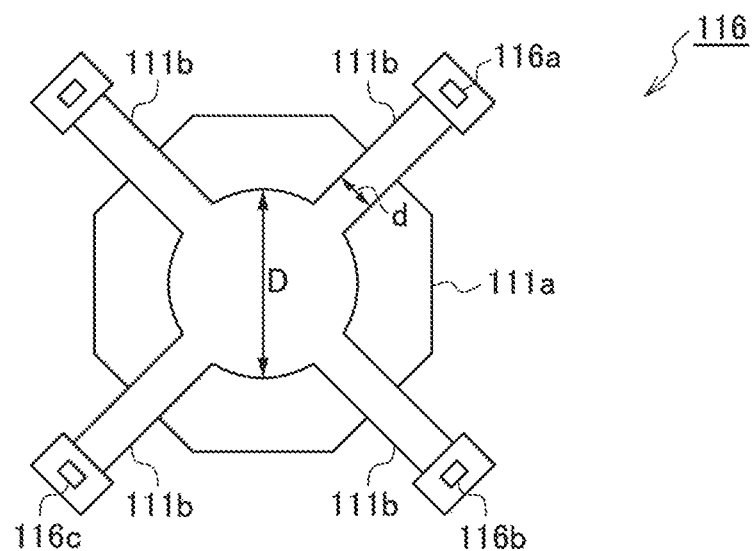
FIG. 1B is a schematic cross-sectional view of a sensor unit 116.

FIG. 1B is a schematic cross-sectional view of the sensor unit 116. To reduce the size of the electron beam irradiation apparatus, a plurality of ports 111b radially extend from the intermediate evacuation line 111a, and a pressure monitor 116a, an $N_2$ introduction module 116b, an atmospheric pressure sensor 116c, and the like are arranged on each port 111b. The pressure monitor 116a monitors the pressure in the vacuum tube 111, monitors the degree of degradation of the electron beam generation apparatus 112, and determines the time of replacement.

The diameter d of each port 111b is preferably equal to or greater than one third of a diameter D of a central part of the intermediate evacuation line 111a (d/D≥1/3). This is because, if the diameter d of each port 111b is too small, the pressure monitor 116a cannot accurately monitor the pressure in the vacuum tube 111.

Referring back to FIG. 1A, the gate valve 11A is openably and closably provided in the vacuum tube 111 and between the aperture 113 and the main chamber module 12. As the gate valve 11A is provided, a vacuum state in the main chamber module 12 and a vacuum state in the vacuum tube 111 can be separated from each other.

The particle catcher 11B is insertably and detachably provided in the vacuum tube 111 and between the gate valve 11A and the main chamber module 12, and prevents particles generated during an operation of the gate valve 11A or the like from dropping into the main chamber module 12.

Figure 1C:
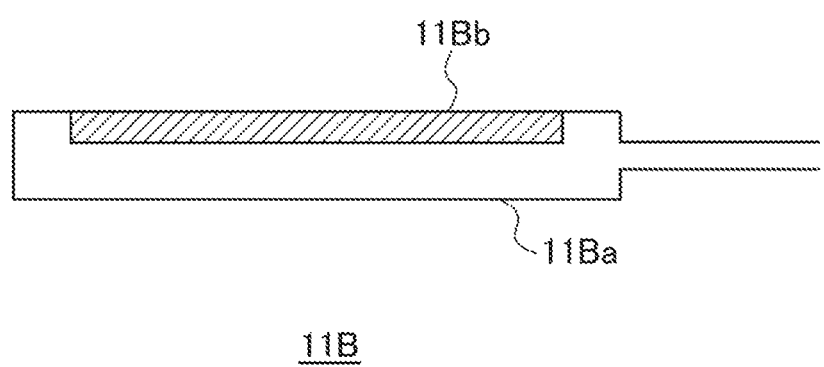
FIG. 1C is a diagram showing a configuration example of a particle catcher 11B.

FIG. 1C is a diagram showing a configuration example of the particle catcher 11B. The particle catcher 11B is composed of a base member 11Ba and an adsorption material 11Bb provided on the base member 11Ba. The adsorption material 11Bb is $SiO_2$ gel or the like and absorbs particles falling in the vacuum tube 111. As the particle catcher 11B is provided, the particles falling in the vacuum tube 111 can be prevented from dropping onto a surface of the sample W arranged in the main chamber module 12.

Referring back to FIG. 1A, the particle catcher 11B can be inserted into and pulled out from an optical axis of the electron beam inside the vacuum tube 111.

The main chamber module 12 has a main chamber 121 that is a vacuum chamber, a gate valve 122, a turbo molecular pump 123, a stage 124, an application pin 125, an aperture 126, and a measurement unit 127.

The gate valve 122 for bringing in and out the sample W is openably and closably provided on a side surface of the main chamber 121. Further, the turbo molecular pump 123 for evacuating air from the main chamber 121 is provided on a bottom surface of the main chamber 121.

The stage 124 is provided in the main chamber 121, and the sample W is placed on the stage 124.

While a configuration example of the application pin 125 will be described in a fifth embodiment described later, the application pin 125 is designed to conduct between pin members 671 and 672 shown in FIG. 6B. Irradiation energy is determined in accordance with a difference between a potential of the electron beam generation apparatus 112 (−0.2 to −5 kV, for example) and a potential of the sample W. However, if the potential of the sample W is floating, the irradiation energy becomes unstable. Therefore, the application pin 125 is provided to apply a constant potential to the sample W.

The aperture 126 is provided in the main chamber 121 and above the stage 124. An opening 126a is provided in the aperture 126, and defines the shape of the electron beam and which region of the sample W is to be irradiated with the electron beam.

Figure 1D:
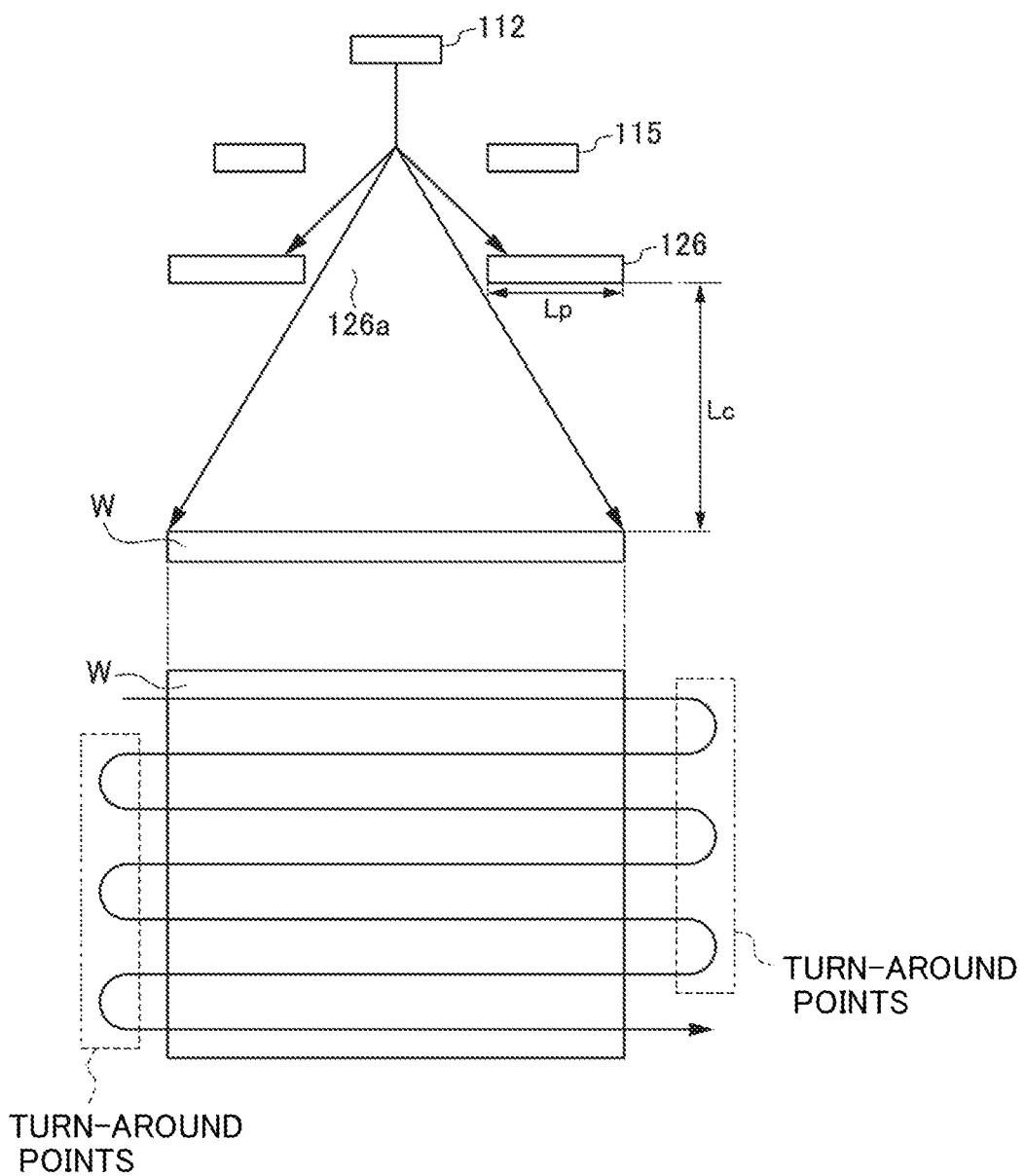
FIG. 1D is a diagram for explaining a role of an aperture 126.

FIG. 1D is a diagram for explaining a role of the aperture 126. An upper part of FIG. 1D is a schematic diagram of the electron beam irradiation apparatus viewed from a side, and a lower part of FIG. 1D is a schematic diagram of the sample W and a scanned electron beam viewed from above. The deflector 115 deflects the electron beam so that the electron beam from the electron beam generation apparatus 112 scans on the sample W. In the scanning, the electron beam might not be uniform at turn-around points. Therefore, portions of the electron beam corresponding to the turn-around points are blocked by the aperture 126, so that the sample W can be irradiated with a uniform electron beam.

Here, when a distance between the aperture 126 and the surface of the sample W is Lc a distance between an edge portion of the opening 126a and an edge portion of the aperture 126 is Lp, Lp/Lc is preferably equal to or greater than 1.5. That is, an aspect ratio of a space between a lower surface of the aperture 126 and an upper surface of the sample W is preferably 1.5 or higher. By designing in this way, electrons reflected by the surface of the sample W are reflected several times and fly to outer peripheral portions. Thus, influences of noise can be reduced.

Referring back to FIG. 1A, the measurement unit 127 measures the electron beam, and is provided below the stage 124 in the main chamber 121. Details of the measurement unit 127 will be described in a fourth embodiment.

The controller 13 has an entire controller 131, an electron beam controller 132, a peripheral controller 133, and a block manifold 134.

The entire controller 131 controls operation of the entire electron beam irradiation apparatus including the electron beam controller 132, the peripheral controller 133, and the block manifold 134. The entire controller 131 may be composed of a processor and a memory. Various programs to be executed by the processor may be stored into the memory in advance, or may be additionally stored into the memory in a later stage (or can be updated).

The electron beam controller 132 controls irradiation and deflection of the electron beam by controlling the electron beam generation apparatus 112 and the deflector 115. Control examples will be described in first to third embodiments.

The peripheral controller 133 controls the turbo molecular pumps 118 and 123, a dry pump 119, and the like.

The block manifold 134 performs opening/closing control of the gate valves 117, 11A, and 122 (air pressure control).

The electron beam irradiation apparatus operates as follows. In a case where the sample W is to be irradiated with an electron beam, the gate valve 11A is opened, and the particle catcher 11B is moved away from the optical axis of the electron beam. Further, the air is evacuated from the vacuum tube 111 and the main chamber 121. In this state, the electron beam generation apparatus 112 emits the electron beam. The electron beam passes through the opening of the aperture 113, is deflected by the deflector 115, and further passes through the opening of the aperture 126, to reach the surface of the sample W. The electron-beam irradiated region is large, and is about 10×10 mm to 500×500 mm, for example.

Next, to scan the electron beam on the sample W will be described. In the electron beam irradiation apparatus, the deflector 115 deflects the electron beam in an XY direction (a two-dimensional direction on the surface of the sample W) according to control of the electron beam controller 132, so that the surface of the sample W is uniformly irradiated with the electron beam.

Figure 1F:
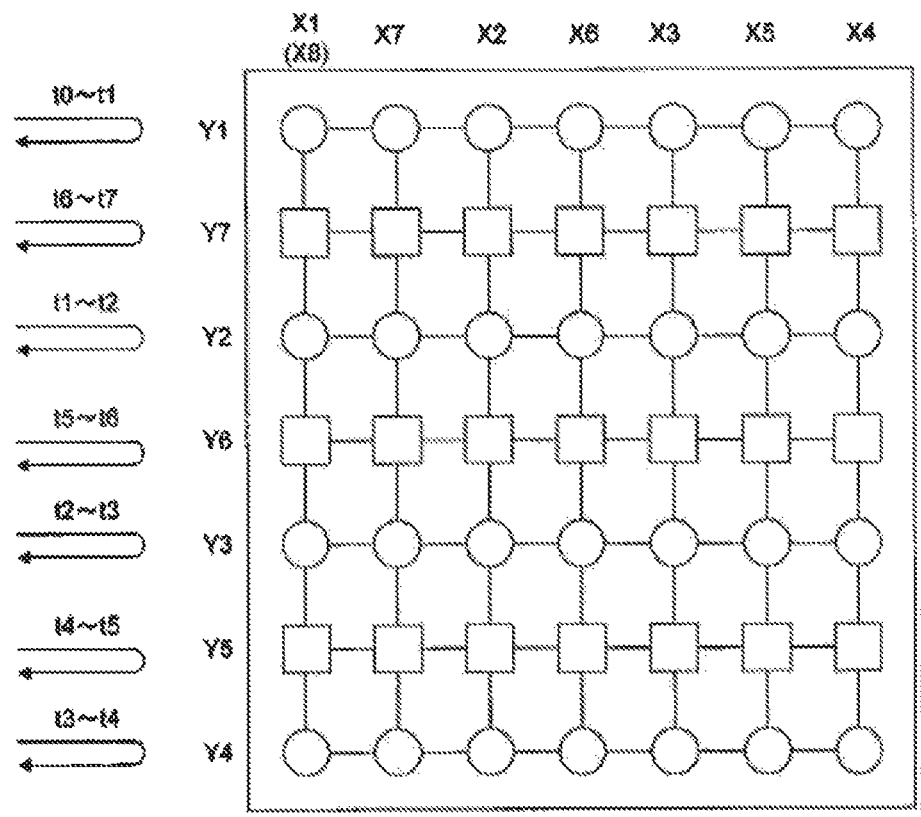
FIG. 1F is an explanatory diagram of control of deflecting an electron beam in the XY direction.

FIGS. 1E and 1F are explanatory diagrams of control of deflecting the electron beam in the XY direction. More specifically, FIG. 1E is a diagram showing temporal changes in the coordinates (the X-coordinate and the Y-coordinate) of the deflected electron beam, and FIG. 1F is a plan view showing a situation where the electron beam is deflected in the XY direction (a plan view of the sample W viewed from an electron beam source side). In the present specification, the X direction is also referred to as a horizontal direction, and the Y direction is also referred to as a vertical direction, for convenience sake.

During a period from time t0 to time t1, the electron beam is deflected in such a direction (X1, X2, X3, and X4) that the X-coordinate indicating the electron-beam reaching position on the sample W becomes larger (this direction is also referred to as a positive direction of the X-coordinate, a rightward direction in FIG. 1F, and an outward path), and is then deflected in such a direction (X4, X5, X6, and X7) that the X-coordinate becomes smaller (this direction is also referred to as a negative direction, a leftward direction in FIG. 1F, and a return path). During this period, the Y-coordinate of the electron beam remains constant at Y1.

Here, as shown in FIG. 1F, a magnitude relationship of the X-coordinate is expressed as X1<X7<X2<X6<X3<X5<X4. That is, the electron beam is discretely emitted onto the sample W, and irradiation positions alternate in the outward path and the return path. In this manner, the surface of the sample W can be uniformly irradiated with the electron beam.

When the X-coordinate indicating the electron-beam reaching position becomes X8 (=X1) in the return path, the electron beam is deflected in such a direction that the Y-coordinate becomes greater (this direction is a positive direction of the Y-coordinate, and a downward direction in FIG. 1F), and the Y-coordinate of the electron beam becomes Y2.

Similarly, during a period from time t1 to time t2, the electron beam is deflected in such a direction that the X-coordinate becomes greater, and is then deflected in such a direction that the X-coordinate becomes smaller. During this period, the Y-coordinate of the electron beam remains constant at Y2. When the X-coordinate becomes X8 (=X1), the electron beam is deflected in such a direction that the Y-coordinate becomes greater, and the Y-coordinate of the electron beam becomes Y3.

Further, during a period from time t2 to time t3, the electron beam is first deflected in such a direction that the X-coordinate becomes greater, and is then deflected in such a direction that the X-coordinate becomes smaller. During this period, the Y-coordinate of the electron beam remains constant at Y3. When the X-coordinate becomes X8 (=X1), the electron beam is deflected in such a direction that the Y-coordinate becomes greater, and the Y-coordinate of the electron beam becomes Y4.

During a period from time t3 to time t4, the electron beam is first deflected in such a direction that the X-coordinate becomes greater, and is then deflected in such a direction that the X-coordinate becomes smaller. During this period, the Y-coordinate of the electron beam remains constant at Y4. When the X-coordinate becomes X8 (=X1), the electron beam is deflected in such a direction that the Y-coordinate becomes smaller (a negative direction of the Y-coordinate, and an upward direction in FIG. 1F), and the Y-coordinate of the electron beam becomes Y5.

Similarly, during a period from time t4 to time t5, the electron beam is first deflected in such a direction that the X-coordinate becomes greater, and is then deflected in such a direction that the X-coordinate becomes smaller. During this period, the Y-coordinate of the electron beam remains constant at Y5. When the X-coordinate becomes X8 (=X1), the electron beam is deflected in such a direction that the Y-coordinate becomes smaller, and the Y-coordinate of the electron beam becomes Y6.

Further, during a period from time t5 to time t6, the electron beam is first deflected in such a direction that the X-coordinate becomes greater, and is then deflected in such a direction that the X-coordinate becomes smaller. During this period, the Y-coordinate of the electron beam remains constant at Y6. When the X-coordinate becomes X8 (=X1), the electron beam is deflected in such a direction that the Y-coordinate becomes smaller, and the Y-coordinate of the electron beam becomes Y7.

Then, during a period from time t6 to time t7, the electron beam is first deflected in such a direction that the X-coordinate becomes greater, and is then deflected in such a direction that the X-coordinate becomes smaller. During this period, the Y-coordinate of the electron beam remains constant at Y7. When the X-coordinate becomes X8 (=X1), the electron beam is deflected in such a direction that the Y-coordinate becomes smaller (the negative direction of the Y-coordinate, and the upward direction in FIG. 1F), and the Y-coordinate of the electron beam becomes Y1.

Here, as shown in FIG. 1F, a magnitude relationship of the Y-coordinate is expressed as Y1<Y7<Y2<Y6<Y3<Y5<Y4. That is, the electron beam is also discretely emitted onto the sample W in the Y-direction, and irradiation positions alternate in the outward path and the return path. In this manner, the surface of the sample W can be uniformly irradiated with the electron beam.

When the air is evacuated from the main chamber 121, the particle catcher 11B is moved away from the optical axis of the electron beam before the turbo molecular pump 123 is activated. With this arrangement, particles adsorbed by the particle catcher 11B can be prevented from separating from the particle catcher 11B and dropping onto the sample W due to effects of air current caused by the evacuation.

In the electron beam irradiation apparatus described above, the electron beam from the electron beam generation apparatus 112 is deflected by the deflector 115, and a specific area of the sample W is irradiated with the electron beam (see FIG. 1A). However, depending on the characteristics of the deflector 115, a different area from an intended area might be irradiated with the electron beam.

Therefore, a method and a system for adjusting an irradiation area of the electron beam in the electron beam irradiation apparatus will be described.

Figure 2A:
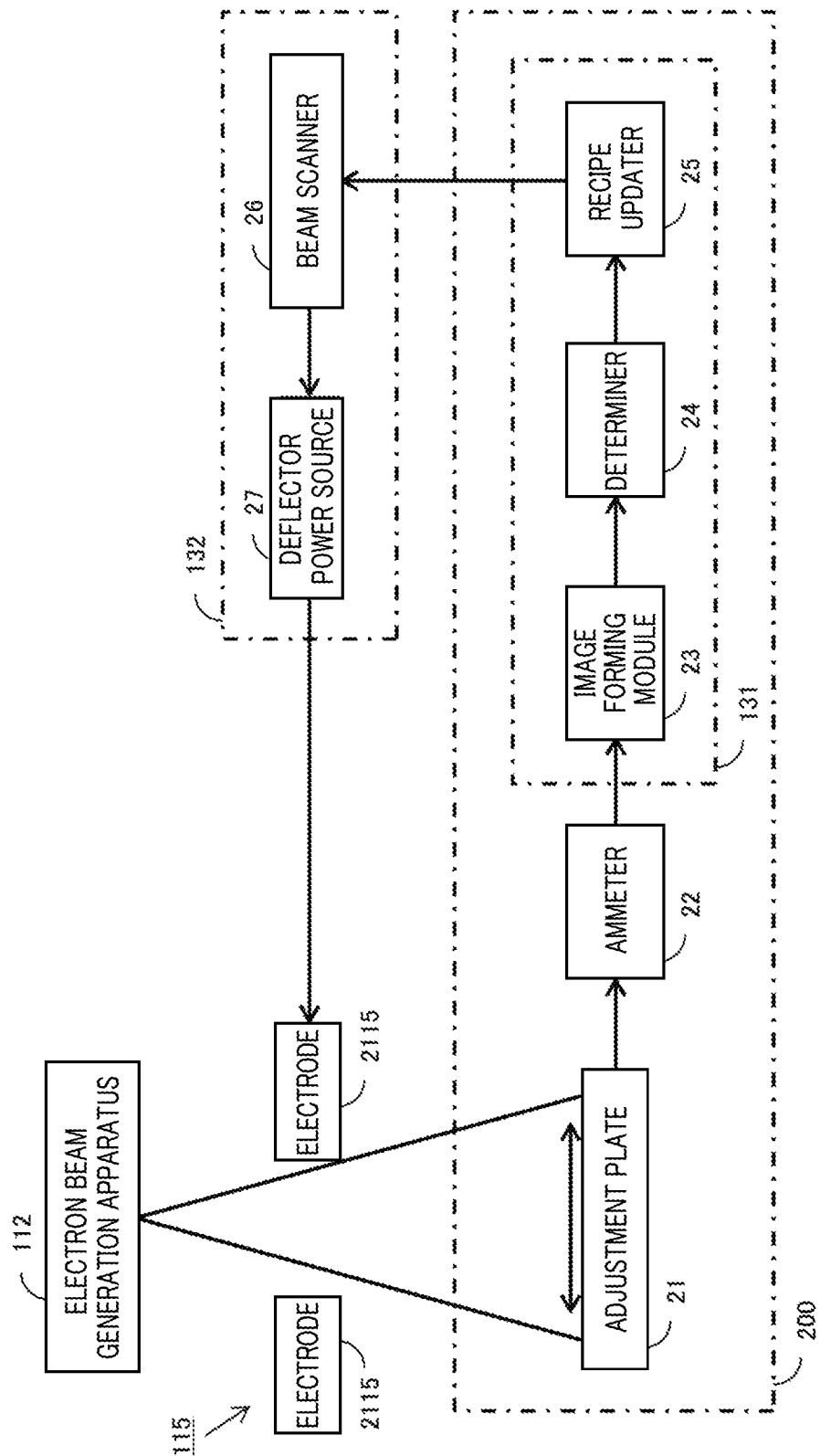
FIG. 2A is a diagram schematically showing an approximate configuration of an irradiation area adjustment system 200 in the electron beam irradiation apparatus.

FIG. 2A is a diagram schematically showing an approximate configuration of an irradiation area adjustment system 200 in the electron beam irradiation apparatus. The irradiation area adjustment system 200 performs adjustment when a sample is not placed on the stage 124 (FIG. 1A), such as when the electron beam irradiation apparatus is activated.

First, as described with reference to FIG. 1A, the electron beam irradiation apparatus includes the electron beam generation apparatus 112, the deflector 115, the electron beam controller 132, and the like.

The deflector 115 in the present embodiment is an electrostatic deflector having a plurality of electrodes 2115. More specifically, the electrodes 2115 in the deflector 115 include two electrodes for deflecting the electron beam in the horizontal direction on a sample (the two electrodes will be hereinafter referred to as electrodes H, although not shown in the drawing), and two electrodes for deflecting the electron beam in the vertical direction (the two electrodes will be hereinafter referred to as electrodes V, although not shown in the drawings). The electron beam is deflected in accordance with voltages applied to the electrodes H and V.

The electron beam controller 132 has a beam scanner 26 and a deflector power source 27. The beam scanner 26 generates a waveform for deflecting the electron beam based on an electron beam irradiation recipe including information of voltages to be applied to the electrodes 2115. The deflector power source 27 generates a voltage corresponding to the waveform and applies the waveform to the electrodes 2115.

The irradiation area adjustment system 200 includes an adjustment plate 21, an ammeter 22, an image forming module 23, a determiner 24, and a recipe updater 25. The image forming module 23, the determiner 24, and the recipe updater 25 may be included in the entire controller 131 shown in FIG. 1A, and may be realized by at least part of the entire controller 131 executing a predetermined program.

The adjustment plate 21 detects a current corresponding to an emitted electron beam and is placed in a predetermined position on the stage 124 (FIG. 1A). That is, the adjustment plate 21 is placed below the sample to be irradiated with the electron beam.

Figure 2B:
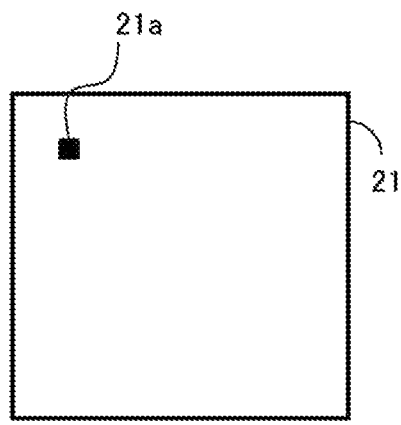
FIG. 2B is a top view schematically showing an adjustment plate 21.

FIG. 2B is a top view schematically showing the adjustment plate 21. The adjustment plate 21 is, for example, a square with side length of 45 mm. The adjustment plate 21 includes a predetermined pattern. In the specific example shown in FIG. 2B, a hole 21a is formed as a pattern at an upper left portion. In a case where a different position from the hole 21a is irradiated with the electron beam, the adjustment plate 21 detects a current. On the other hand, in a case where the hole 21a is irradiated with the electron beam, the adjustment plate 21 detects no current.

Figure 2C:
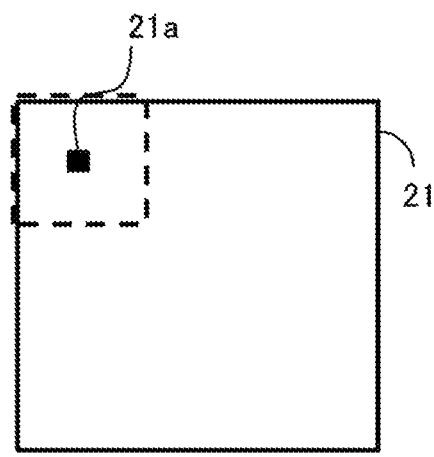
FIG. 2CA is a diagram schematically showing an irradiation area of the electron beam with respect to the adjustment plate 21.
Figure 2C:
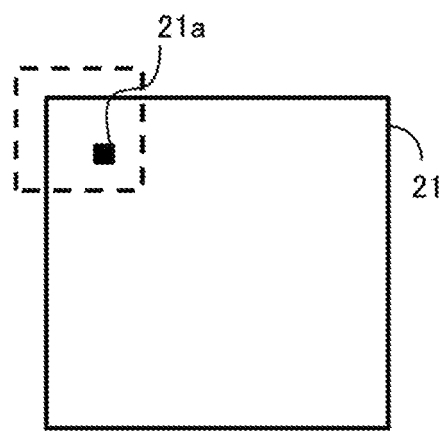

FIGS. 2CA and 2CB are diagrams each schematically showing an irradiation area of the electron beam with respect to the adjustment plate 21. The electron beam is intended to be emitted onto an area indicated by a dashed line in FIG. 2CA. However, as indicated by a dashed line in FIG. 2CB, the electron beam might be emitted onto a different area (an area shifted to an upper left position in FIG. 2CB) from the intended area. Therefore, in the present embodiment, a state shown in FIG. 2CB is to be adjusted to a state shown in FIG. 2CA.

Referring back to FIG. 2A, the ammeter 22 in the irradiation area adjustment system 200 is connected between the adjustment plate 21 and a ground terminal (not shown in the drawings), and acquires a current detected by the adjustment plate 21. The acquired current value is detected by the image forming module 23. The ammeter 22 sequentially acquires currents detected at respective times.

The image forming module 23 forms image data corresponding to the current acquired by the ammeter 22. Specifically, the image forming module 23 operates as follows. First, the image forming module 23 converts a current value at each time into a voltage value. Then, the image forming module 23 converts the voltage values into, for example, 256-level gradations. Then, the image forming module 23 sets the acquired gradations as gradations of respective pixels in the image data.

For example, at a time when a different position from the hole 21a is irradiated with the electron beam, the adjustment plate 21 detects a current. Accordingly, the voltage value becomes greater, and the gradation level becomes 255, for example. Thus, a pixel corresponding to this time is bright. On the other hand, at a time when the hole 21a is irradiated with the electron beam, the adjustment plate 21 detects no current. Accordingly, the voltage value becomes smaller, and the gradation level becomes 0, for example. Thus, a pixel corresponding to this time is dark.

The determiner 24 determines whether or not the irradiation area of the electron beam is appropriate based on the image data formed by the image forming module 23. Specifically, the determiner 24 holds in advance image data to be formed in a case where the irradiation area of the electron beam is appropriate (hereinafter the image data will be referred to as template image data), and makes a determination by comparing the image data formed by the image forming module 23 with the template image data. More specifically, the determiner 24 makes a determination based on a difference in position between the predetermined pattern (corresponding to the hole 21a in FIG. 2B, for example) in the formed image data and the predetermined pattern in the template image data.

In a case where the irradiation area of the electron beam is determined not to be appropriate, the recipe updater 25 updates the electron beam irradiation recipe by taking the difference in position into account. The beam scanner 26 is notified of the updated electron beam irradiation recipe, and thereafter, the updated electron beam irradiation recipe is used. The specific updating method will be described later.

Figure 2D:
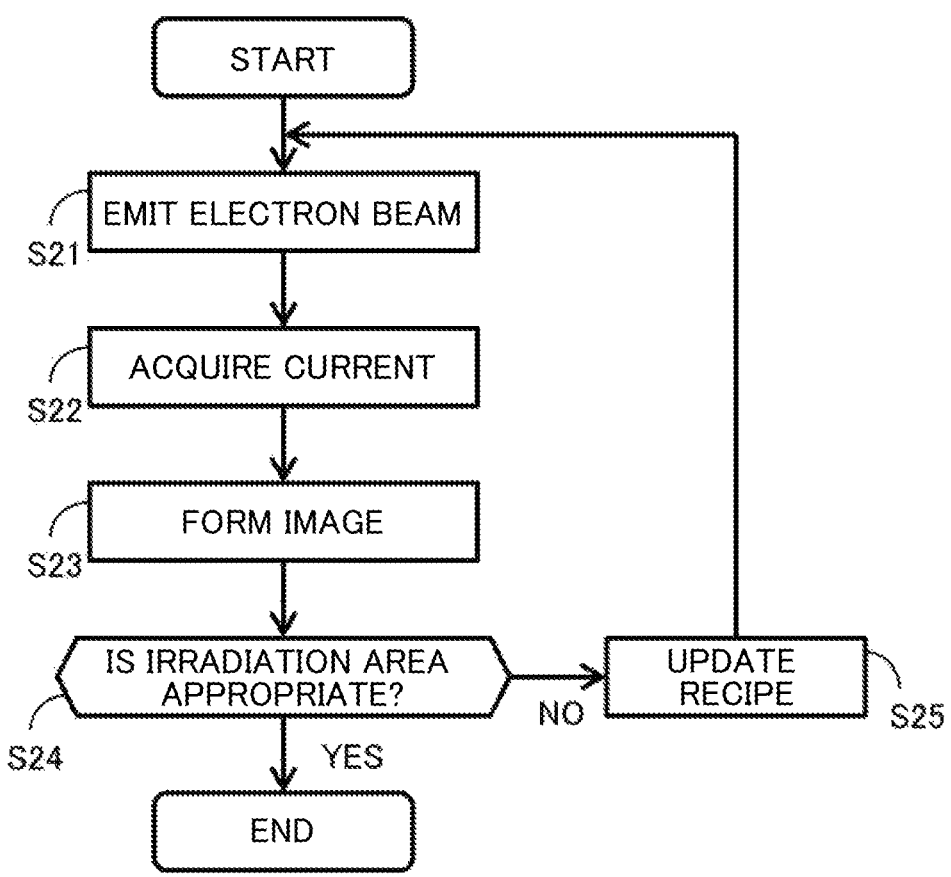
FIG. 2D is a flowchart showing an adjustment procedure of the irradiation area.

FIG. 2D is a flowchart showing an adjustment procedure of the irradiation area. In order to emit the electron beam (step S21) while an irradiation position with respect to the adjustment plate 21 is changed, the electron beam controller 132 controls the voltage to be applied to the electrodes 2115 in the deflector 115 based on the electron beam irradiation recipe. For ease of explanation, the irradiation area of the electron beam is scanned as described below, although the scanning described below differs from that described above with reference to FIGS. 1E and 1F.

Figure 2F:
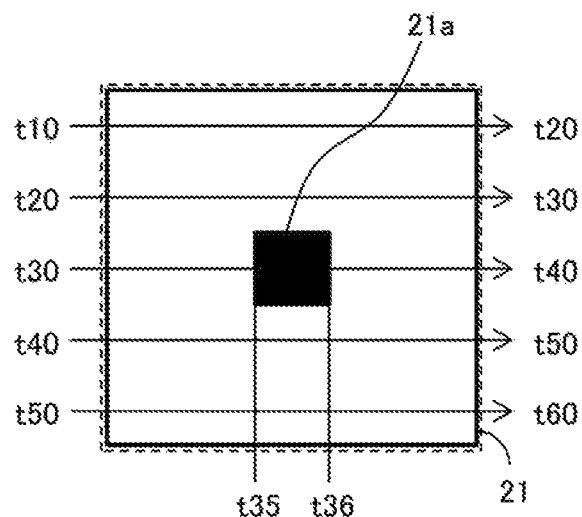
FIG. 2FA is a diagram showing a relationship between the irradiation area in FIG. 2CA and time.
Figure 2F:
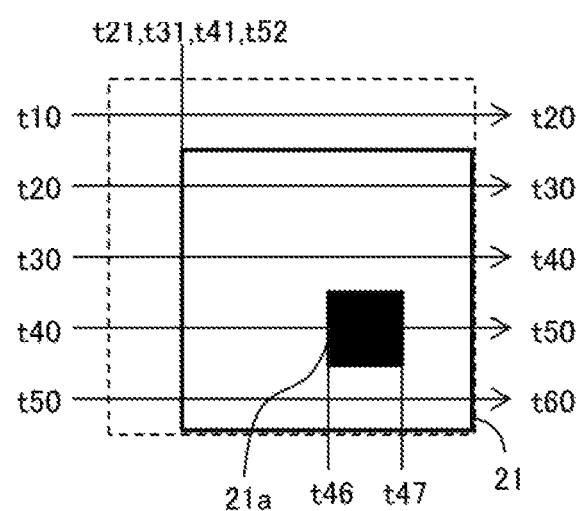

FIG. 2E is a diagram showing temporal changes in the voltages to be applied to the electrodes 2115. More specifically, the upper half of FIG. 2E shows temporal changes in the voltage to be applied to the electrode H for deflecting the electron beam in the horizontal direction, and the lower half shows temporal changes in the voltage to be applied to the electrode V for deflecting the electron beam in the vertical direction. These waveforms are included in the electron beam irradiation recipe. FIGS. 2FA and 2FB are diagrams showing relationships between time and the irradiation areas shown in FIGS. 2CA and 2CB, respectively.

During a period from time t10 to time t20 in FIG. 2E, the voltage to be applied to the electrode V is constant (for example, −3 V), and the voltage to be applied to the electrode H linearly increases from −2 V to 2 V, for example.

Therefore, as shown in FIGS. 2FA and 2FB, during the period from time t10 to t20, the irradiation position of the electron beam is constant in the vertical direction, but moves in the horizontal direction (this is called a first line).

At time t20 in FIG. 2E, the voltage to be applied to the electrode V increases (for example, to −2.25 V). During a period from time t20 to time t30, the voltage to be applied to the electrode H also linearly increases. Therefore, as shown in FIGS. 2FA and 2FB, during the period from time t20 to time t30, the irradiation position of the electron beam is constant in the vertical direction at a different position from that between time t10 and time t20, and moves in the horizontal direction (this is called a second line). Thereafter, the same process is repeated until a fifth line, and the scanning of the irradiation area is then completed.

Referring back to FIG. 2D, the ammeter 22 acquires a current detected at each time from the adjustment plate 21 (step S22).

Figure 2G:
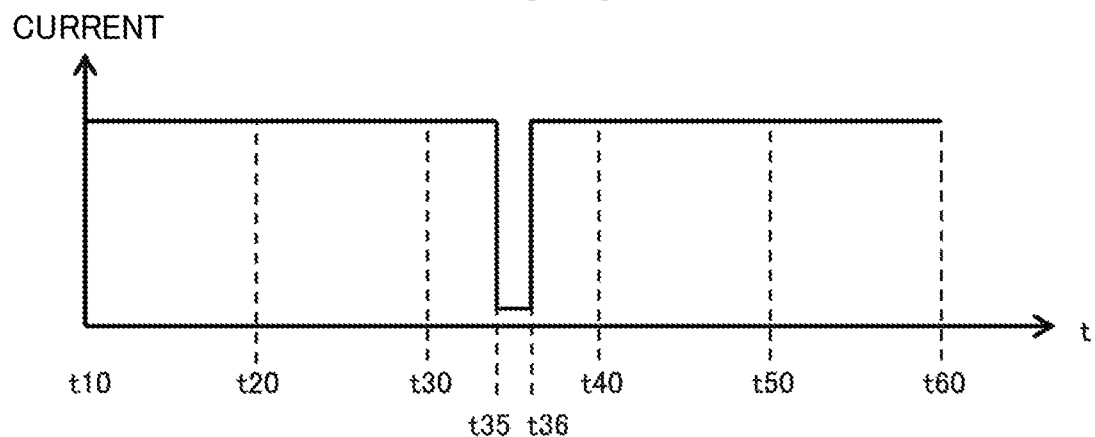
FIG. 2GA is a diagram showing temporal changes in an acquired current value.
Figure 2G:
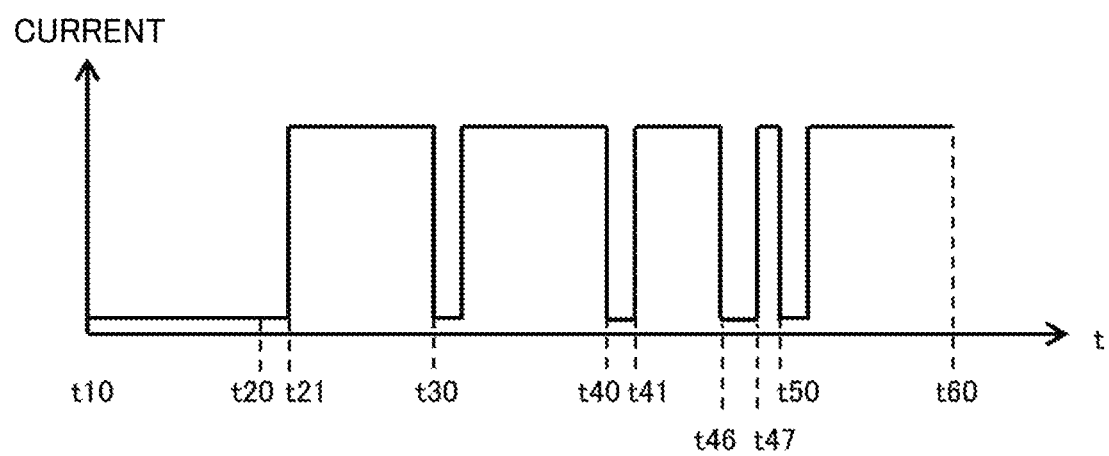

FIG. 2GA is a diagram showing temporal changes in the acquired current value, and corresponds to FIG. 2FA.

During the period from time t10 to time t20 of the first line, a position that is not the hole 21a of the adjustment plate 21 is irradiated with the electron beam (FIG. 2FA). Therefore, during the period from time t10 to time t20, a constant current value is acquired (FIG. 2GA). The same goes for time t20 to time t30 of the second line.

On a third line, during a period from time t30 to time t35, a position that is not the hole 21a of the adjustment plate 21 is irradiated with the electron beam (FIG. 2FA), and therefore, the same current value as that during the period from time t10 to time t30 is acquired (FIG. 2GA). On the other hand, during the next period from time t35 to time t36, the hole 21a of the adjustment plate 21 is irradiated with the electron beam (FIG. 2FA), and therefore, current hardly flows (FIG. 2GA). Thereafter, during a period from time t35 to time t40, a position that is not the hole 21a of the adjustment plate 21 is irradiated with the electron beam, and therefore, the same current value as that during the period from time t10 to time t35 is acquired (FIG. 2GA).

During a period from time t40 to time t50 of a fourth line and during a period from time t50 to time t60 of the fifth line, the same process as that for the first line and the second line is performed. Therefore, the current values shown in FIG. 2GA are acquired.

FIG. 2GB is a diagram showing temporal changes in the acquired current value, and corresponds to FIG. 2FB.

During the period from time t10 to time t20 of the first line, the adjustment plate 21 is not located in a position to be irradiated with the electron beam (FIG. 2FB), and therefore, current hardly flows (FIG. 2GB).

On the second line, during a period from time t20 to time t21, the adjustment plate 21 is not located in a position to be irradiated with the electron beam (FIG. 2FB), and therefore, current hardly flows (FIG. 2GB). Thereafter, during a period from time t21 to time t30, a position that is not the hole 21a of the adjustment plate 21 is irradiated with the electron beam, and therefore, a constant current value is acquired (FIG. 2GB). The same goes for the third line.

On the fourth line, during a period from time t40 to time t41, the adjustment plate 21 is not located in a position to be irradiated with the electron beam (FIG. 2FB), and therefore, current hardly flows (FIG. 2GB). Thereafter, during a period from time t41 to time t46, a position that is not the hole 21a of the adjustment plate 21 is irradiated with the electron beam, and therefore, the same current value as that during a period from time t21 to time t30 is acquired (FIG. 2GB). During the next period from time t46 to time t47, the hole 21a of the adjustment plate 21 is irradiated with the electron beam (FIG. 2FB), and therefore, current hardly flows (FIG. 2GB). Thereafter, during the next period from time t47 to time t50, a position that is not the hole 21a of the adjustment plate 21 is irradiated with the electron beam, and therefore, the same current value as that during the period from time t21 to time t30 is acquired (FIG. 2GB).

During the period from time t50 to time t60 of the fifth line, the same process as that for the second line and the third line is performed. Therefore, the current values shown in FIG. 2GB are acquired.

Referring back to FIG. 2D, the image forming module 23 forms image data corresponding to the acquired current value (step S23).

Figure 2H:
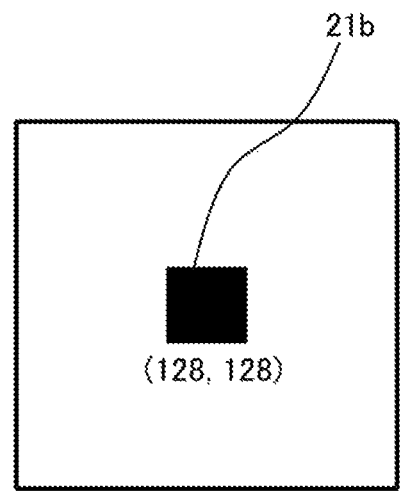
FIG. 2HA is a diagram showing image data formed corresponding to the current values shown in FIG. 2GA.
Figure 2H:
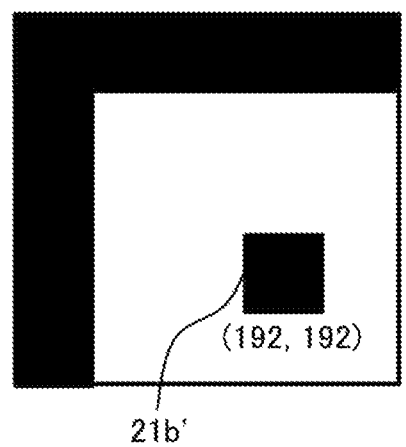

FIG. 2HA is a diagram showing image data formed corresponding to the current values shown in FIG. 2GA. The current value during the period from time t10 to time t20 corresponds to each pixel value on the first line in the image data. Since the current value is large during the period from time t10 to time t20, each pixel value on the first line is large, and each pixel on the first line is bright. As the same applies to the later lines, only pixels corresponding to time t35 to time t36 of the third line are dark in the image data shown in FIG. 2HA. This dark position corresponds to the hole 21a shown in FIG. 2B.

This image data is image data formed in a case where an intended area shown in FIG. 2CA is irradiated with the electron beam. In other words, this image data is the template image data. The template image data can be theoretically created based on a pattern of the intended irradiation area on the adjustment plate 21, and the determiner 24 that will be next explained holds the template image data in advance. The template image data includes a pattern 21b corresponding to a pattern (the hole 21a) of the adjustment plate 21.

FIG. 2HB is a diagram showing image data formed corresponding to the current values shown in FIG. 2GB. In FIG. 2GB, current hardly flows during the period from time t10 to time t20. Therefore, the first line of the image data shown in FIG. 2HB is dark. Also, current hardly flows during periods from time t20 to time t21, from time t30 to time t31, from time t40 to time t41, and from time t50 to time t51. Therefore, a left edge of the image data is also dark. Further, current hardly flows during a period from time t46 to time t47 of the fourth line. Therefore, a dark pattern 21b' appears at part of the fourth line. This pattern 21b' corresponds to the pattern (the hole 21a) of the adjustment plate 21.

Referring back to FIG. 2D, the determiner 24 determines whether the irradiation area of the electron beam is appropriate (step S24). Specifically, the determiner 24 performs pattern matching between the template image data held in advance and the image data formed in step S23.

The template image data is shown in FIG. 2HA, and the image data formed in step S23 is shown in FIG. 2HB. The determiner 24 calculates a positional relationship, which is a distance D, between the pattern 21b in the template image data shown in FIG. 2HA and the pattern 21b' in the image data shown in FIG. 2HB. When the distance D is equal to or shorter than a predetermined allowable value, the determiner 24 determines the irradiation area to be appropriate (YES in step S24 in FIG. 2D), and ends the adjustment.

On the other hand, when the distance D is longer than the allowable value, the irradiation area is determined not to be appropriate (NO in step S24). In this case, the recipe updater 25 updates the electron beam irradiation recipe (step S25). More specifically, the recipe updater 25 changes the waveform generated by the beam scanner 26 (for example, to a voltage waveform shown in FIG. 2E). The longer the distance D, the larger the amount of change.

Figure 2I:
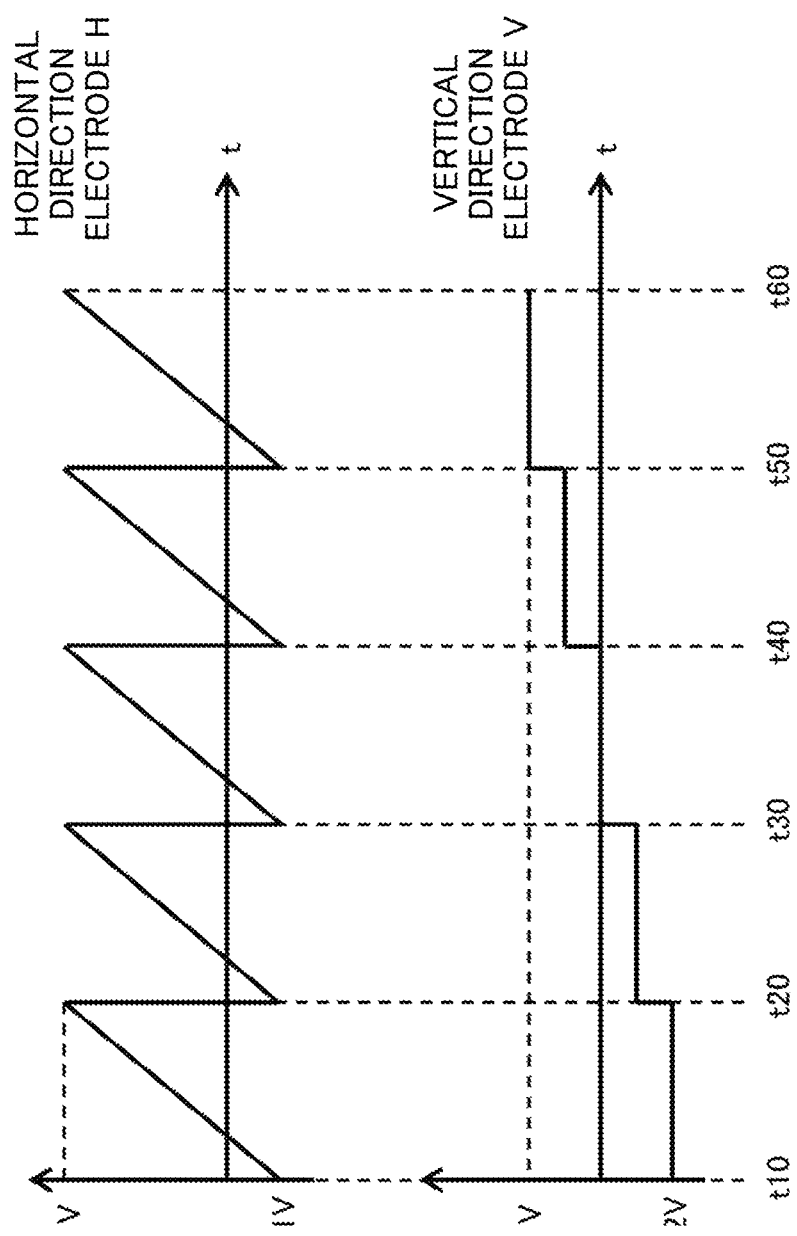
FIG. 2I is a diagram showing temporal changes of an adjusted voltage applied to the electrode 2115.

For example, the number of pixels in each image data is 256×256, the position of the pattern 21b in the template image data (FIG. 2HA) is (128, 128), and the position of the pattern 21b' in the image data (FIG. 2HB) formed in step S23 is (192, 192). In this case, the irradiation area is shifted 25% of image size in the horizontal direction and in the vertical direction. Therefore, the waveform shown in FIG. 2E is adjusted by 25%. That is, a voltage in a range of −2 V to 2 V is applied to the electrode H in the horizontal direction in FIG. 2E, but the voltage range is changed to −1 V to 3 V (the upper half of FIG. 2I). A voltage in a range of −3 V to 1 V is applied to the electrode V in the vertical direction, but the voltage range is changed to −2 V to 2 V (the lower half of FIG. 2I). Thereby, the irradiation area of the electron beam moves in the horizontal direction and the vertical direction, so that an appropriate area is irradiated with the electron beam.

The adjustment may be completed at this time point, but steps S21 and the following steps are preferably repeated until the irradiation area is determined to be appropriate in step S24. While these steps are repeated, the electron beam irradiation recipe updated in step S25 is applied in step S21.

In this way, the irradiation area of the electron beam can be adjusted by using the adjustment plate 21 where a predetermined pattern is formed. By this adjustment method, there is no need to use any actual mask, and no masks are wasted.

Although the scanning shown in FIG. 2E is adopted for ease of explanation, the same adjustment as above can be performed in cases where the scanning shown in FIGS. 1E and 1F is performed.

In this way, the irradiation area of the electron beam can be adjusted. However, such adjustment can be performed on the premise that deflection sensitivity is constant. The deflection sensitivity is a relationship between a voltage [V] applied to the electrode 2155 and a distance [mm] on the stage 124 where the electron bean is deflected. For example, when the deflection sensitivity is 5 [mm/V], if the voltage applied to the electrode 2155 is increased by 1 [V], a position which the electron beam from the electron beam generation apparatus 112 reaches is shifted by 5 [mm] on the stage 124.

The deflection sensitivity may vary when the electron beam irradiation apparatus is started up, the electron beam generation apparatus 112 is replaced, the external magnetic field varies, or maintenance is performed. When the deflection sensitivity varies, the irradiation area of the electron beam emitted in step S21 in FIG. 2D varies, so that the image formed in step S23 in FIG. 2D varies.

Figure 3A:
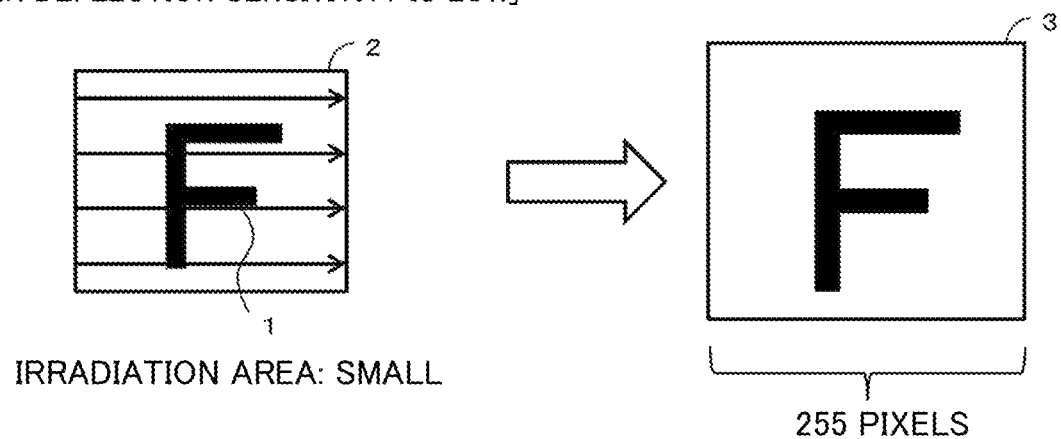
FIG. 3A is a diagram for explaining that a formed image varies depending on deflection sensitivity.
Figure 3A:
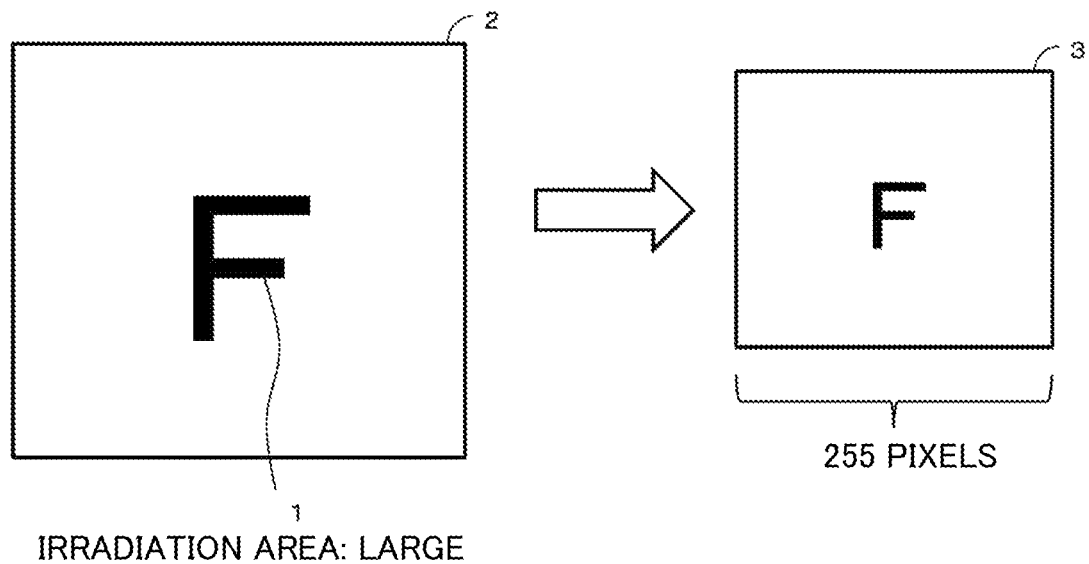

FIG. 3A is a diagram for explaining that a formed image varies depending on the deflection sensitivity. For ease of explanation, an F-shaped sample 1 placed on the stage 124 is irradiated with the electron beam and an image 3 is formed.

When the deflection sensitivity is low, the electron beam is not deflected so much by the deflector 115, so that an electron beam irradiation area 2 is small. In other words, only a small area around the sample 1 is irradiated with the electron beam. The number of pixels of the formed image 3 is a fixed value (for example, 255 pixels) regardless of the size of the electron beam irradiation area 2, so that the sample 1 in the formed image 3 is relatively large.

On the other hand, when the deflection sensitivity is high, the electron beam is largely deflected by the deflector 115, so that the electron beam irradiation area 2 is large. In other words, a large area around the sample 1 is irradiated with the electron beam. The number of pixels of the formed image 3 is a fixed value regardless of the size of the electron beam irradiation area 2, so that the sample 1 in the formed image 3 is relatively small.

If such a variation of the deflection sensitivity is not grasped, the size of the pattern in the image formed by using the adjustment plate 21 (step S23 in FIG. 2D) also varies in the irradiation area adjustment method described above. As a result, the pattern matching in step S24 in FIG. 2D fails, and an appropriate adjustment cannot be performed. Therefore, a method of calculating the deflection sensitivity will be described below.

An approximate configuration of the deflection sensitivity calculation system may be the same as that shown in FIG. 2A. However, the adjustment plate 21 of which the size is known is used. In the description below, the adjustment plate 21 has a rectangular shape (or a square shape) with a horizontal direction length of Dx [mm] and a vertical direction length of Dy [mm]. Such an adjustment plate 21 is placed on the stage 124 in advance.

Figure 3B:
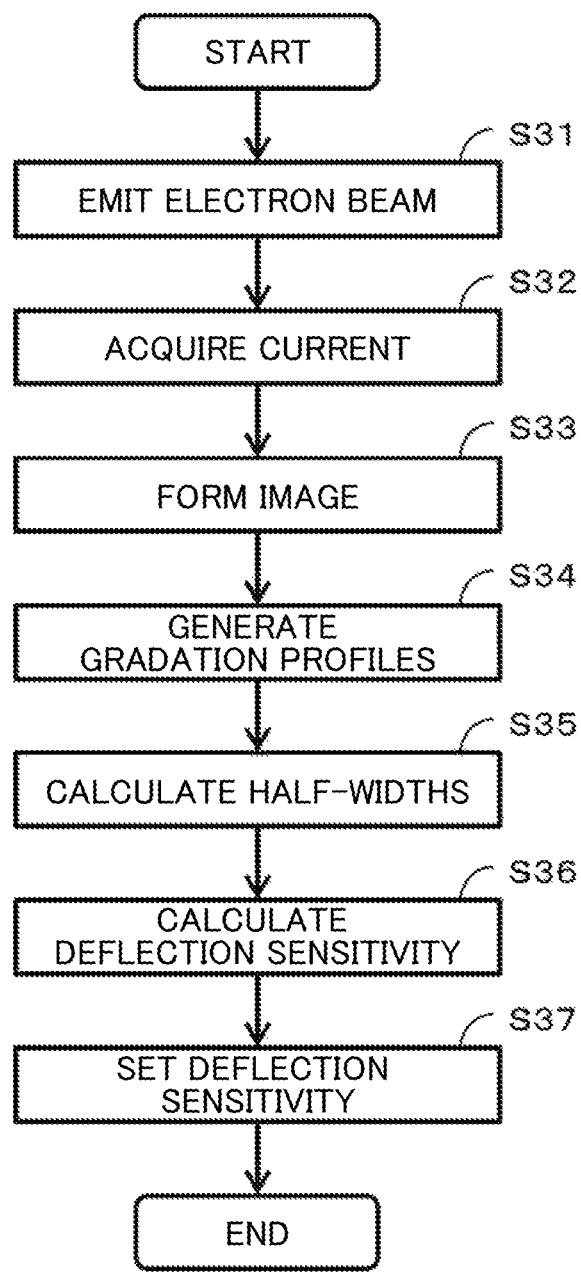
FIG. 3B is a flowchart showing a deflection sensitivity setting procedure.

FIG. 3B is a flowchart showing a deflection sensitivity setting procedure.

First, an area that covers the entire adjustment plate 21 is irradiated with an electron beam (step S31). Specifically, the electron beam controller 132 scans a voltage applied to the electrodes 2115 in the deflector 115 based on the electron beam irradiation recipe. A difference between a maximum voltage and a minimum voltage for scanning the electron beam in the horizontal direction is defined as a horizontal scanning voltage width Vx [V], and a difference between a maximum voltage and a minimum voltage for scanning the electron beam in the vertical direction is defined as a vertical scanning voltage width Vy [V]. The horizontal scanning voltage width Vx and the vertical scanning voltage width Vy are defined in the electron beam irradiation recipe.

Then, the ammeter 22 acquires current at each time which is detected from the adjustment plate 21 (step S32). When the electron beam is irradiated onto the adjustment plate 21, current flows, so that the current value detected by the ammeter 22 increases. When the electron beam is irradiated to a position away from the adjustment plate 21, current hardly flows, so that the current value detected by the ammeter 22 decreases (or becomes almost zero).

Then, the image forming module 23 forms an image corresponding to the acquired current value (step S33). Steps S31 to S33 described above are the same as steps S21 to S23 in FIG. 2D.

Figure 3C:
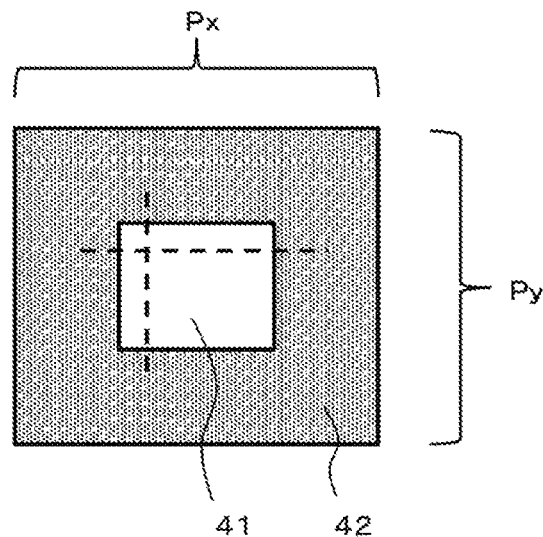
FIG. 3C is a diagram schematically showing an image formed in step S33.

FIG. 3C is a diagram schematically showing the image formed in step S33. As shown in FIG. 3C, there is a high gradation part 41 near the center of the image, and there is a low gradation part 42 (represented by spots) around the high gradation part 41. The high gradation part 41 corresponds to the adjustment plate 21, and the low gradation part 42 corresponds to the outside of the adjustment plate 21. The number of horizontal direction pixels Px [pixels] and the number of vertical direction pixels Py [pixels] of the entire image are already known.

Referring back to FIG. 3B, a gradation profile generator (not shown in the drawings) in the determiner 24 generates gradation profiles in the horizontal direction and in the vertical direction of the image data (step S34). The gradation profiles need not be profiles of the entire image, but may be profiles of portions which cross at least the high gradation part 41 as shown in dashed lines in FIG. 3C.

Figure 3D:
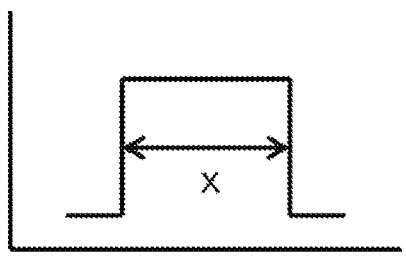
FIG. 3DA is a diagram schematically showing a horizontal direction profile.
Figure 3D:
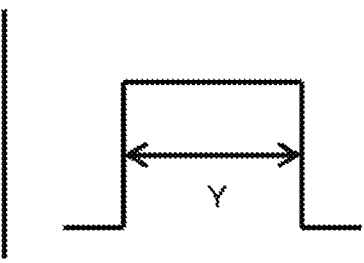

FIG. 3DA is a diagram schematically showing a profile in the horizontal direction. The profile in the horizontal direction is gradation values of coordinates horizontally crossing the high gradation part 41 in the image data. FIG. 3DB is a diagram schematically showing a profile in the vertical direction. The profile in the vertical direction is gradation values of coordinates vertically crossing the high gradation part 41 in the image data. In FIGS. 3DA and 3DB, the horizontal axis represents coordinates (one pixel corresponds to one coordinates) and the vertical axis represents gradation values.

Referring back to FIG. 3B, the number of pixels calculator (not shown in the drawings) in the determiner 24 calculates half-widths X and Y [pixels] in the horizontal direction and the vertical direction respectively based on the profiles in the horizontal direction and the vertical direction (step S35, also refer to FIGS. 3DA and 3DB). The half-width X in the horizontal direction represents the number of pixels in the horizontal direction of the high gradation part 41 and indicates the number of pixels in the image to which the horizontal direction length Dx of the adjustment plate 21 corresponds. Similarly, the half-width Y in the vertical direction represents the number of pixels in the vertical direction of the high gradation part 41 and indicates the number of pixels in the image to which the vertical direction length Dy of the adjustment plate 21 corresponds.

Next, a deflection sensitivity calculator (not shown in the drawings) in the determiner 24 calculates deflection sensitivity Sx in the horizontal direction based on the length Dx of the adjustment plate in the horizontal direction, the horizontal scanning voltage width Vx, the number of horizontal direction pixels Px of the image, and the half-width X. Further, the determiner 24 calculates deflection sensitivity Sy in the vertical direction based on the length Dy of the adjustment plate in the vertical direction, the vertical scanning voltage width Vy, the number of vertical direction pixels Py of the image, and the half-width Y (step S36). Specifically, the deflection sensitivity Sx and the deflection sensitivity Sy are calculated by the following formulas (1) and (2).

$$Sx[mm/V]=(Dx[mm]\cdot Px[pixels])/(X[pixels]\cdot Vx[V]) \quad (1)$$

$$Sy[mm/V]=(Dy[mm]\cdot Py[pixels])/(Y[pixels]\cdot Vy[V]) \quad (2)$$

In the above formula (1), Dx/X indicates that one pixel of the image in the horizontal direction corresponds to how many mm on the stage 124. Therefore, Dx×Px/X indicates that the entire image in the horizontal direction corresponds to how many mm on the stage 124. Therefore, by dividing this value by Vx, a distance deflected by 1 V on the stage 124, that is, the deflection sensitivity Sx, can be obtained. The same goes for the above formula (2).

The deflection sensitivities Sx and Sy calculated in this way are set as apparatus constants of the electron beam irradiation apparatus (the electron beam irradiation recipe) (step S37). In step S21 in FIG. 2D, by performing appropriate voltage control (setting of the horizontal scanning voltage width Vx and the vertical scanning voltage width Vy) based on the deflection sensitivities Sx and Sy, the irradiation area becomes constant even when the deflection sensitivities Sx and Sy vary, so that the irradiation area of the electron beam can be appropriately adjusted.

The deflection sensitivities may be defined by the reciprocals of the above formulas (1) and (2). Further, the deflector 115 may be a magnetic field deflector having a magnetic pole. In this case, the electron beam is deflected by supplying current to the magnetic pole. That is, when the deflector 115 is an electrostatic deflector, a deflection parameter that controls deflection of the deflector 115 is a voltage, and when the deflector 115 is a magnetic field deflector, a deflection parameter that controls deflection of the deflector 115 is a current.

The calculation of deflection sensitivity described above may be performed, for example, when the electron beam irradiation apparatus is started up, the electron beam generation apparatus 112 is replaced, the external magnetic field varies, or maintenance is performed.

Second Embodiment

Figure 4:
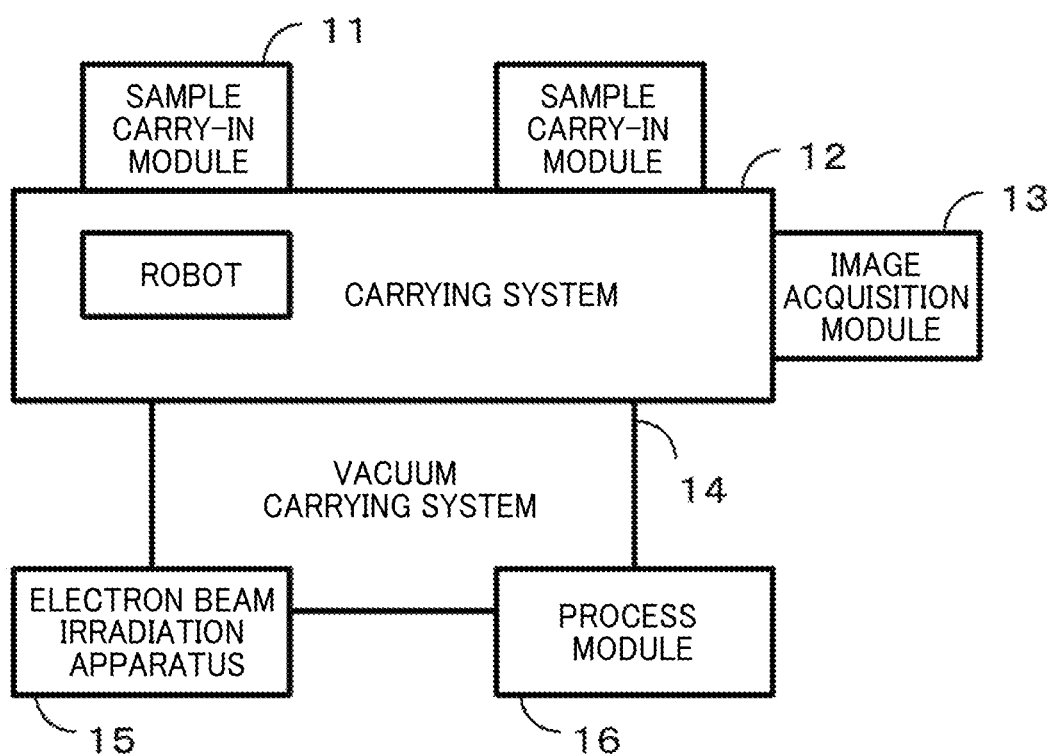
FIG. 4 is a schematic configuration diagram showing an embodiment of a process apparatus including the electron beam irradiation apparatus.

FIG. 4 is a schematic approximate configuration diagram showing an embodiment of a process apparatus including the electron beam irradiation apparatus described above. The process apparatus includes a sample carry-in module 11, a carrying system 12 including a robot or the like, an image acquisition module 13, a vacuum carrying system 14, an electron beam irradiation apparatus 15, a process module 16, and the like. A sample from the sample carry-in module 11 is loaded to the electron beam irradiation apparatus 15 and the process module 16 by the carrying system 12 and the vacuum carrying system 14 and processed. The processed sample is unloaded by the vacuum carrying system 14 and the carrying system 12.

In the process apparatus, the carrying system 12 is provided with the image acquisition module 13. The image acquisition module 13 has a CMOS camera, a CCD camera, or a line sensor, and can acquire an entire image or a partial image of, for example, a sample that is being carried by the robot. Image data is accumulated while the sample is loaded and unloaded. The image acquisition module 13 may be located inside a housing of the carrying system or may be externally connected.

Normal or abnormal is determined by comparing the image data every time the sample is loaded or unloaded. When the sample is loaded, whether the sample is normal or not is determined, and when the sample is unloaded, whether the process is normal or not is determined.

For normality determination, the shape, color, and size of the sample may be determined by providing threshold values to be used as determination criteria.

Further, for the normality determination, AI (Artificial Intelligence) using deep learning and/or machine learning may be utilized. The "normal" may be defined by using data that has been determined to be normal as teacher data of the AI.

Further, an AI function need not necessarily be in the process apparatus, but may be in Fog connected to the Internet through a gateway or may be in a cloud connected to Fog.

FIG. 4 is merely an example of the process apparatus, and can be applied to a plating apparatus, CMP, a bevel polisher, an exposure apparatus, an etching apparatus, CVD, other semiconductor manufacturing apparatuses, and an inspection apparatus in addition to the process apparatus including the electron beam irradiation apparatus 15 and the process module 16. Further, FIG. 4 can be applied to various samples such as a wafer in addition to a mask.

What is claimed is:

1. A deflection sensitivity calculation method for calculating deflection sensitivity of a deflector in an electron beam irradiation apparatus that irradiates an irradiation object on a stage with an electron beam by causing the deflector to deflect the electron beam, the deflection sensitivity calculation method comprising:

irradiating an area that covers an adjustment plate with an electron beam by scanning a deflection parameter that controls deflection of the deflector in a predetermined width, a size the adjustment plate being known, the adjustment plate being placed on the stage, the adjustment plate detecting a current corresponding to the irradiated electron beam;

detecting a current value detected from the adjustment plate;

forming an image corresponding to the detected current value, a number of pixels of the image being known;

calculating the number of pixels of a portion corresponding to the adjustment plate in the formed image; and calculating the deflection sensitivity of the deflector based on the size of the adjustment plate, the predetermined width for scanning the deflection parameter, the number of pixels of the image, and the number of pixels of the portion corresponding to the adjustment plate in the image.

2. The deflection sensitivity calculation method according to claim 1, wherein the adjustment plate has a rectangular shape of which a length in a first direction is Dx and of which a length in a second direction perpendicular to the first direction is Dy, and when assuming that the predetermined widths for scanning the deflection parameter in the first direction and the second direction are Vx and Vy, respectively, and that the numbers of pixels of the image in the first direction and the second direction are Px and Py, respectively, and and that the numbers of pixels of the portion corresponding to the adjustment plate in the image in the first direction and the second direction are X and Y, respectively, deflection sensitivity Sx in the first direction is represented by a following formula (1) or a reciprocal thereof, and deflection sensitivity Sy in the second direction is represented by a following formula (2) or a reciprocal thereof:

$$Sx=(Dx \cdot Px)/(X \cdot Vx) \quad (1)$$

$$Sy=(Dy \cdot Py)/(Y \cdot Vy) \quad (2).$$

3. The deflection sensitivity calculation method according to claim 1, wherein upon forming the image, the image is formed by converting the current value acquired each time into a gradation level of each pixel in the image.

4. The deflection sensitivity calculation method according to claim 1, wherein upon calculating the number of pixels, a gradation profile of the image is generated, and a half-width of the generated profile is defined as the number of pixels of the portion corresponding to the adjustment plate.

5. The deflection sensitivity calculation method according to claim 1, further comprising setting the calculated deflection sensitivity as an apparatus constant of the electron beam irradiation apparatus.

6. The deflection sensitivity calculation method according to claim 1, wherein
the deflector is an electrostatic deflector comprising an electrode, and
the deflection parameter is a voltage value applied to the electrode.

7. The deflection sensitivity calculation method according to claim 1, wherein
the deflector is a magnetic field deflector comprising a magnetic pole, and
the deflection parameter is a current value supplied to the magnetic pole.

8. The deflection sensitivity calculation method according to claim 1, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

9. The deflection sensitivity calculation method according to claim 2, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

10. The deflection sensitivity calculation method according to claim 3, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

11. The deflection sensitivity calculation method according to claim 4, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

12. The deflection sensitivity calculation method according to claim 5, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

13. The deflection sensitivity calculation method according to claim 6, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

14. The deflection sensitivity calculation method according to claim 6, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

15. The deflection sensitivity calculation method according to claim 7, wherein the deflection sensitivity calculation method is performed when
the electron beam irradiation apparatus is started up,
an electron beam generation apparatus is replaced in the electron beam irradiation apparatus, the external magnetic field varies, and
maintenance is performed.

16. A deflection sensitivity calculation system for calculating deflection sensitivity of a deflector in an electron beam irradiation apparatus that irradiates an irradiation object on a stage with an electron beam by causing the deflector to deflect the electron beam, the deflection sensitivity calculation system comprising:

an adjustment plate that detects a current corresponding to the irradiated electron beam, a size of the adjustment plate being known, the adjustment plate being placed on the stage;

an ammeter that detects a current detected from the adjustment plate while an area that covers the adjustment plate is irradiated with the electron beam by scanning a deflection parameter that controls deflection of the deflector in a predetermined width;

an image forming module that forms an image corresponding to the detected current value;

a number of pixels calculator that calculates a number of pixels of a portion corresponding to the adjustment plate in the formed image; and a deflection sensitivity calculator that calculates the deflection sensitivity of the deflector based on a size of the adjustment plate, the predetermined width for scanning the deflection parameter, the number of pixels of the image, and the number of pixels of the portion corresponding to the adjustment plate in the image.

* * * * *